(12) United States Patent
Ehwald et al.

(10) Patent No.: US 6,878,995 B2
(45) Date of Patent: Apr. 12, 2005

(54) CMOS-COMPATIBLE LATERAL DMOS TRANSISTOR AND METHOD FOR PRODUCING SUCH A TRANSISTOR

(75) Inventors: Karl-Ernst Ehwald, Frankfurt (DE); Bernd Heinemann, Frankfurt (DE); Dieter Knoll, Frankfurt (DE); Wolfgang Winkler, Frankfurt (DE)

(73) Assignee: IHP GmbH - Innovations for High Performance Microelectronics (DE)

(*) Notice: Subject to any disclaimer, the term of this patent is extended or adjusted under 35 U.S.C. 154(b) by 0 days.

(21) Appl. No.: 10/239,933

(22) PCT Filed: Mar. 24, 2001

(86) PCT No.: PCT/DE01/01175

§ 371 (c)(1),
(2), (4) Date: Sep. 26, 2002

(87) PCT Pub. No.: WO01/75979

PCT Pub. Date: Oct. 11, 2001

(65) Prior Publication Data

US 2003/0094657 A1 May 22, 2003

(30) Foreign Application Priority Data

Mar. 31, 2000 (DE) .......................................... 100 04 387
Dec. 18, 2000 (DE) .......................................... 100 63 135

(51) Int. Cl.⁷ .......................................... H01L 21/335
(52) U.S. Cl. ..................................... 257/335; 257/401
(58) Field of Search .................. 257/E29.07, E29.066, 257/E29.256, 335, 401; 438/286, 306

(56) References Cited

U.S. PATENT DOCUMENTS

| | | | |
|---|---|---|---|
| 5,108,940 A | | 4/1992 | Williams |
| 5,306,656 A | * | 4/1994 | Williams et al. ............. 438/283 |
| 5,406,110 A | | 4/1995 | Kwon et al. |
| 5,517,046 A | * | 5/1996 | Hsing et al. ................. 257/336 |
| 5,911,104 A | * | 6/1999 | Smayling et al. ............ 438/202 |
| 5,994,189 A | | 11/1999 | Akiyama |
| 6,054,736 A | | 4/2000 | Shigehara et al. |
| 6,190,978 B1 | * | 2/2001 | D'Anna ........................ 438/301 |
| 6,518,138 B1 | * | 2/2003 | Hsing ........................... 438/306 |
| 6,545,316 B1 | * | 4/2003 | Baliga .......................... 257/329 |

FOREIGN PATENT DOCUMENTS

| | | |
|---|---|---|
| EP | 228107 | 7/1987 |
| EP | 522670 | 1/1993 |
| JP | 9-125904 A1 | 4/1998 |
| WO | WO 97/04488 | 2/1997 |

OTHER PUBLICATIONS

Wolf S. "Silicon Processing for the VLSI–ERA: Volume 1–Process Technology", 1986, Lattice Pr., vol. 1, pp. 281–282.*

(Continued)

*Primary Examiner*—George Fourson
(74) *Attorney, Agent, or Firm*—Hahn Loeser & Parks, LLP; Robert J. Clark

(57) ABSTRACT

A CMOS-compatible DMOS transistor can be designed by virtue of a suitable layout configuration optionally for very high drain voltages or for power amplification at very high frequencies and which can be produced at a low level of additional cost in comparison with a conventional sub-$\mu$m production technology for CMOS circuits. A gate insulator of the transistor is of a unitary thickness under a control gate in the entire (active) region through which current flows. A zone of increased doping concentration (well region) which is near the surface and which determines the transistor threshold voltage is so arranged under the control gate that it occupies the entire area under the control gate which is on the active region and ends within a so-called drift space between the control gate and a highly doped drain region. The entire surface of the drift space is covered by a zone of the conductivity type of the drain region (VLDD), which is lowly doped in comparison with the highly doped drain region.

8 Claims, 1 Drawing Sheet

OTHER PUBLICATIONS

Yoshida, et al., "Highly Efficient UHF–Band Si Power MOSFET for RF Power Amplifiers," Electronics and Communications in Japan, Scripta Technica (USA), vol. 77 (No. 4), p. 10–18, (Sep. 16, 1994).

Appels, et al., "Highly Voltage Thin Layer Devices,"Inter'l Electron Devices Meeting, Document XP002157835 (Washington, DC), p. 238–41, ( Dec. 3, 1979).

Yoshida, "2–GHz Si Power MOSFET Technology," IEDM, IEEE (USA), p.51–54, (1997).

Efland, et al., "Lateral Thinking about Power Devices (LDMOS)," IEDM, IEEE (USA), p. 679–682, (1998).

Xu, et al., "RF LDMOS with Extreme Low Parasitic Feedback Capacitance and High Hot–Carrier Immunity," IEDM, IEEE (USA), p. 201–204, (1999).

German International Search Report for International Application No. PCT/DE01/01175 Aug. 26, 2004.

* cited by examiner

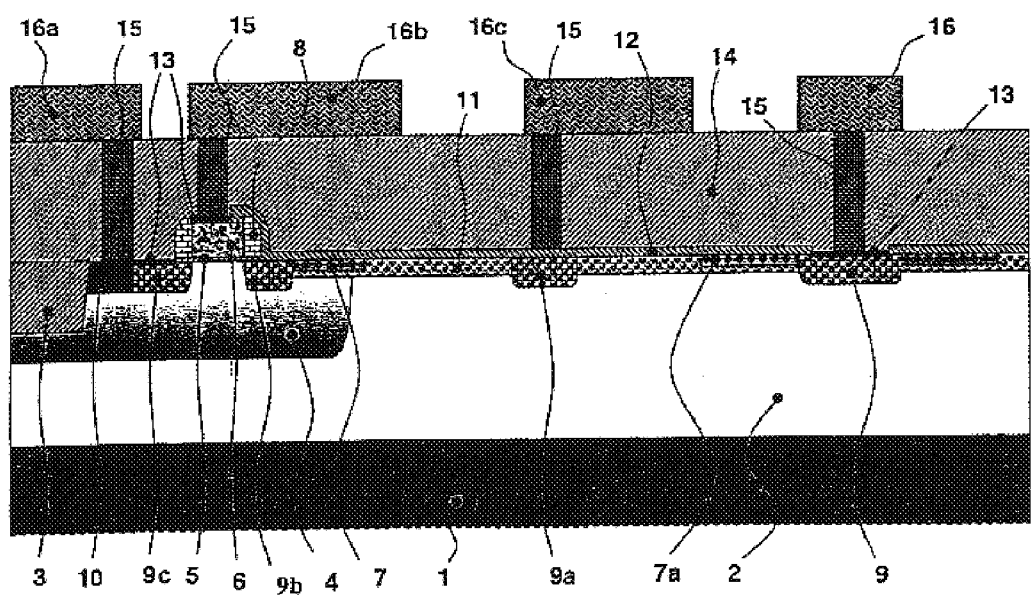
(Fig. 1)

CMOS-COMPATIBLE LATERAL DMOS TRANSISTOR AND METHOD FOR PRODUCING SUCH A TRANSISTOR

The invention concerns a CMOS-compatible lateral DMOS transistor and a method of producing such a transistor.

BACKGROUND OF THE INVENTION

A large number of lateral DMOS transistor constructions are known both for use as a high-voltage device with a drain voltage of more than 100 V and also for high-frequency power amplification at medium operating voltages, for example in the range of between 10V and 20V. A known type of LDMOS constructions uses a stepped gate insulator for reducing the field strength at the drain edge of the control gate. An example is the so-called field gap or thick field drift region arrangements which are particularly suitable for high drain voltages, being described for example in I Yoshida et al, IEDM Techn. Dig. 1997, pages 51–53, and T R Efland et al, IEDEM Tech. Dig. 1998, pages 679–682. The latter construction however cannot be readily scaled with typical field oxide thicknesses of about 0.5 $\mu$m for very high limit frequencies (length of the drift region <0.5 $\mu$m for $f_1$>20 GHz) and it is only limitedly compatible with a standard CMOS technology.

In particular, doping of the edge areas of the field region gives rise to problems in spite of an additional lacquer mask for a LDD implantation under the field region when dealing with modern insulation techniques, for example when employing the so-called 'shallow trench' technology.

Other constructions, instead of the normal thin gate dielectric of the standard transistors, use a separately produced, thicker gate insulator for the DMOS structures in the entire control gate region or in a part thereof, see T R Efland et al, IED Tech. Dig. 1998, pages 679–682, which also involves a considerable degree of additional expenditure and which in the former case additionally reduces the saturation gradient of the transistors. Further known constructions (so-called active gap or low voltage planar arrangements, as described in I Yoshida et al, IEDM Techn. Dig. 1997, pages 51–53, and T R Efland et al, IEDEM Tech. Dig. 1998, pages 679–682) avoid the above-indicated technological disadvantages insofar as they require substantially only the standard CMOS process for the production thereof, but they do not attain an optimum compromise between their drain breakdown voltage, the on resistance ($R_{on}$) and the limit frequency. In particular there is greater difficulty in ensuring adequate long-term stability as a consequence of increased hot electron effects due to excessively high field strengths at the gate edge at the drain side.

It was recently proposed that doping of the LDD region in the drift space should be stepped by what is referred to as a split LDD process, with the LDD doping being reduced in that case of the proximity of the gate edge to such an extent that in that region, with an adequate drain voltage, complete depletion of free charge carriers is achieved and as a result the hot electron effect and the drain/gate capacitance are reduced, see S Xu et al, IEDM Tech. Dig. 1999, pages 201–204. That proposal however at any event requires an additional lacquer mask in comparison with the CMOS standard process. In spite of that measure the on resistance $R_{on}$ is comparatively high due to the necessarily extremely low level of LDD doping in the proximity of the gate edge and simultaneous realisation of optimised HF-DMOS transistors together with DMOS transistors for very high drain breakdown voltages (>100 V) and a low on resistance $R_{on}$ is not possible as a consequence of the higher doping at the drain side of the LDD region which cannot be depleted.

The object of the invention is to eliminate the above-indicated disadvantages of the state of the art and to propose a CMOS-compatible DMOS transistor and method of producing such a transistor, which can be designed by virtue of a suitable layout configuration optionally for very high drain voltages or for power amplification at very high frequencies and which can be produced at a low level of additional cost in comparison with a conventional sub-$\mu$m production technology for CMOS circuits. At the same time, without the production cost being increased, the aim is to provide that the product of on resistance $R_{on}$ and drain-gate capacitance is reduced, for a given breakdown voltage.

SUMMARY OF THE INVENTION

That object is attained by the features of the main claim and the further independent claims.

In the transistor construction according to the invention the zone which determines the threshold voltage and which is near the surface, with an increased level of doping concentration (the so-called well region) occupies the entire active surface under the control gate and additionally at least a part of the drift space between the control gate and the highly doped drain region. A semiconductor zone, which is of low doping relative to the highly doped drain region, of the same conductivity type (VLDD region) is produced in that drift space between the control gate and the drain, in self-adjusting relationship, with respect to the drain edge of the control gate. In that case the nett doping of that VLDD region is selected to be so low (<$5 \times 10^{12}$ doping atoms per cm$^2$) that at least in the region of the drift space which adjoins the control gate and which is provided with the well doping, at a drain voltage below the breakdown voltage of the thin gate insulator, that VLDD region is totally depleted in respect of free charge carriers when the control gate is non-conducting. That provides that the semiconductor potential in the proximity of the gate edge does not follow a further increase in the drain voltage, or follows it only with a substantially reduced rise, and no unacceptably high electrical field strength occurs even in an extremely thin gate insulator, even when a high drain voltage is involved. Optimising the vertical doping profile outside the well region and the VLDD doping means that it is possible to provide that, at the boundary of the well region, within the drift space, there is a lateral potential drop in a direction towards the control gate, which reduces the field strength maxima which usually occur at the drain and gate edges. In comparison with the structure described by S Xu et al, the VLDD doping in the proximity of the gate edge does not have to be reduced, because of the higher level of well doping which is present there and which overlaps the drift space, but can even be set to be markedly higher, with regard to $R_{on}$, than in the other part of the drift space, although the potential can be kept very low, for example at 2V, in the case of total depletion of that region. As a result, without other disadvantages occurring, the on resistance $R_{on}$ is reduced is comparison with the previously known structures. A further advantage of this construction with a VLDD region which is totally depleted at least in the well region even at a low drain voltage is that, in the case of RF-DMOS structures with a very short channel length, the window in the lacquer mask for source implantation does not have to end at the control gate but may overlap the drift space. In that case, in source/drain implantation, formed between the control gate and the drift space is a floating, narrow, highly doped region, the potential of which is limited to a value below the breakdown voltage of the gate insulator, by virtue of the upstream-disposed, totally depleted VLDD zone, even when high drain voltages are involved. Due to the length of the drift space and the position of the boundary of the well region within the drift space, the breakdown voltage and the high-frequency characteristics of the DMOS transistor can be optimally adapted to the respective circuitry requirements. Production of the CMOS-compatible DMOS transistor can desirably be so effected that the gate insulator, the control gate, the well region, the source and drain regions as well as all contacts and conductor tracks can be produced simultaneously with the corresponding partial regions of the normal circuit transistors, without entailing any additional technological complication and expenditure. In this respect, in the simplest case, the VLDD region can be produced by mask-less additional implantation which for example is effected after structuring of the control gate of the MOS transistors, or the VLDD region is implanted by an additional lacquer mask which is not required in the normal CMOS process, or doping of that region is effected by the combination of large-area ion implantation with implantation by way of an additional lacquer mask. In the latter case it is possible to achieve a particularly desirable, triple-stepped potential distribution in the drift space, which is described in the specific embodiment.

In a further advantageous configuration of the DMOS transistor construction according to the invention, a field plate which is arranged in the first conductor track plane above the part of the drift space adjoining the control gate and which is connected to the gate or the source of the DMOS transistor serves to shield the semiconductor potential in the part of the drift space under the field plate, from possible static charges of the insulator surface.

In a further configuration a second field plate which is connected to a drain region arranged floatingly in the drift space is disposed over the part of the drift space which adjoins the highly doped drain region. That second field plate is preferably formed from the metal of the uppermost or a higher conductor track plane and in dependence on the desired breakdown voltage can form an overlap region with the first field plate or may only cover a part of the exposed drift space in the proximity of the highly doped drain region.

For uses with breakdown voltages >200 V the above-mentioned field plates can be replaced by a plurality of mutually insulated metal strips which are arranged in an annular configuration around the drain electrode and which are each connected to a respective small highly doped region of the conductivity type of the drain region. The above-mentioned small floating highly doped regions are in that case basically arranged in the part of the drift space which is outside the well region and serve for fixing a potential which is correctly stepped for a uniform field distribution in the drift space on the above-mentioned annular metal strips and on the semiconductor surface.

A further advantageous configuration of the invention for high breakdown voltages achieves a more uniform field distribution in the transitional region between the well region and the more weakly doped part of the drift space by virtue of a specific configuration of the stencil with which the resist mask for implantation of the well region is produced. In this case, produced in the proximity of the lateral well boundary which is in the drift space are very small incisions, perforations or interruptions in the resist mask, which in terms of their dimensions are smaller than or comparable to the vertical depth of penetration of the well region in the finished component. In that way the lateral doping gradient is also reduced at the edge of the well region. Particularly when using very highly resistive substrates, for the purposes of setting an optimum potential distribution in the drift space, it may be desirable additionally to implant a doping element of the conductivity type of the well region in mask-less implantation or implantation effected by way of a lacquer mask of the VLDD regions, outside the well region. If necessary it is also possible to use a separate lacquer mask for that purpose. In that case the implantation energy is so selected that the depth of penetration is markedly greater than that of the actual VLDD implantation operation, but at least the major part of that additional doping is in the space charge region in the event of total depletion of the VLDD region. The dosage in relation to surface area of that additional doping of the conductivity type of the well region is lower than or equal to the nett dosage in the VLDD region thereabove. With that measure, with a predetermined maximum potential in the VLDD region (in the event of total depletion thereof) it becomes possible for the nett doping of the VLDD region to be increased in the drift region outside the p-well region and for $R_{on}$ to be correspondingly reduced.

BRIEF DESCRIPTION OF THE DRAWING

Better understanding of the present invention will be had by reference to the appended drawing, which shows a side sectional view of the device of the present invention.

DETAILED DESCRIPTION OF A PREFERRED EMBODIMENT

Besides the claims features of the invention are also to be found in the description, the embodiments by way of example and the drawing, in which respect the individual features respectively represent in themselves alone or in pluralities in the form of sub-combinations patentable configurations in respect of which protection is claimed here. The invention is described in greater detail hereinafter in a number of embodiments by way of example. The accompanying drawing diagrammatically shows the structure of a CMOS-compatible lateral DMOS transistor according to the invention.

EXAMPLE 1

Taking Si wafers with a p-substrate 1 and a weakly doped epitaxial layer 2, standard CMOS process steps are used firstly to produce the field oxide regions 3, the p-well regions 4, the gate oxide 5 and the poly-Si regions 6. Then the VLDD regions 7 and 7a are produced through the windows of a lacquer mask which is not involved in the normal CMOS process, prior to production of the gate spacers 8, by As-implantation at low energy and with a dose of $<10^{13}/cm^2$. Thereafter the CMOS standard process is continued with production of the gate spacers 8, implantation of the n$^+$ regions 9, 9a, 9c and the p$^+$ regions 10.

Disposed between the control gate 6 and the VLDD regions 7 is a floating highly doped pseudo-drain region 9b of the conductivity type of the highly doped drain region 9, which directly adjoins the control gate 6 and whose maximum potential is controlled by the region 7 of the VLDD area, the region 7 already being totally depleted at drain voltages below the gate breakdown voltage.

As a further process which is not included in the standard procedure, there then follows an unmasked P-implantation operation for production of the more weakly doped VLDD regions 11. Thereafter the entire surface of the drift space is covered by a zone of the conductivity type of the drain region (VLDD regions 7, 11, 7a), which is lowly doped in comparison with the highly doped drain region 9 and in which the area-related nett doping concentration does not exceed a value of $5 \cdot 10^{12}$ At/cm$^2$. The standard process is then continued with deposit and structuring of the salicide blocker layer 12, salicification of the regions 13, deposit and planarisation of the insulator layer 14, etching and metal filling of the contact windows 15 and deposit and structuring of the first aluminum conductor track plane. The DMOS transistor produced with the foregoing technological procedure and whose source region 9c is formed with an outwardly disposed source connection 16a annularly around the highly doped drain region 9, which is at the center of the structure, with the drain contact 16, has two metal rings 16b and 16c, for stabilisation of an optimum field distribution in the drift space, the metal rings covering the drift space for a large part. The metal ring 16b which is adjacent to the control gate is conductively connected thereto and covers the more highly doped VLDD region 7 in the well region. When the maximum drain voltage is applied, the second metal ring 16c is at a mean positive potential which is markedly lower in comparison with the drain voltage and is set by way of the n+region 9a which acts as a potential probe and which is within the drift space.

The outer edges of the metal ring 16c extend approximately parallel to the equipotential lines of the drift space surface. The regions 16, 16a, 16b, 16c are a constituent part of one or more conductor track planes of the standard conductor track system for integrated circuits. With the arrangement diagrammatically shown in FIG. 1, the drain potential can be reduced in a staircase configuration in a plurality of steps in a direction towards the control gate. In that case the height of the first step is given by the voltage required for total depletion of the more highly doped VLDD region 7a adjoining the drain region. By optimising the lateral geometry of the described LDMOS transistor, it can be provided that, with the lowest possible on resistance $R_{on}$, the drain breakdown voltage is determined by vertical avalanche breakdown between the highly doped drain region and the substrate. In that way, it is possible, with the same technological procedure, to produce fast MOS transistors for logic uses with low operating voltages simultaneously with RF-DMOS power transistors for medium operating voltages and with high-voltage transistors for several 100 V, on the same wafer. The additional production expenditure in that respect only involves an additional lacquer mask and masked ion implantation and ion implantation implemented over a large area.

EXAMPLE 2

Taking Si wafers with a p-substrate 1 and a weakly doped epitaxial layer 2, standard CMOS process steps are used firstly to produce the field oxide regions 3, the p-well regions 4, the gate oxide 5 and the poly-Si regions 6, wherein in accordance with the invention the lacquer mask used for masking the doping of the well region 4 is provided within the drift space at the mask edge and/or in the proximity thereof with suitably arranged incisions, perforations or interruptions which are as small as possible, wherein the implantation energy and the heat loading effective after implantation for the well region 4 are so selected that the depth of penetration of the well region 4, in the region of the drift space, is at least comparable to the dimensions of said incisions, perforations or interruptions. The further procedure is as described in Example 1.

EXAMPLE 3

In a further alternative embodiment, after production of the field oxide regions 3, the p-well regions 4, the gate oxide 5 and the poly-Si regions 6, by CMOS process steps, the VLDD region is doped without a mask over a large area by ion implantation. In other respects the procedure is as described in Example 1 or Example 2.

EXAMPLE 4

After production of the field oxide regions 3, the p-well regions 4, the gate oxide 5 and the poly-Si regions 6 by CMOS process steps, doping of the VLDD region is implemented by a combination of ion implantation marked by a lacquer mask and large-area ion implantation, in such a way that, in the masked ion implantation step, a sub-region of the drift space which directly adjoins the highly doped drain region (9) is covered. The other method steps are completed as described in Examples 1 and 2.

In the foregoing description, a CMOS-compatible lateral DMOS transistor and method of producing such a transistor were described on the basis of an actual specific embodiment. It should be noted however that the present invention is not limited to the details of the description in the specific embodiment as modifications and alternations are claimed within the scope of the claims.

What is claimed is:

1. A CMOS-compatible lateral DMOS transistor, comprising:

a gate insulator having a unitary thickness under a control gate in an entire active region through which current flows;

a doped well region near a surface of the transistor, the well region determining the transistor threshold voltage, the well region being so arranged under the control gate that the well region occupies the entire area under the control gate on an active region and ends within a drift space between the control gate and a highly doped drain region, a highly doped zone of the same conductivity type as the highly doped drain region, said highly doped zone directly adjoining the control gate;

wherein at least a semiconductor region immediately beside and under the highly doped drain region has a markedly lower doping concentration in comparison with the doping concentration of the well region, wherein the drift space between time control gate and the highly doped drain region has a surface that is totally covered by a VLDD region of the same conductivity type as the drain region, wherein the VLDD region is lowly doped in comparison with the highly doped drain region, the area-related net doping concentration in the VLDD region not exceeding a value of $5 \times 10^{12}$ At/cm$^2$, such that upon application of a drain voltage which is below the breakdown voltage of the gate insulator the VLDD region is totally depleted of free charge carriers up to the semiconductor surface, at least in the part of the drift space, which adjoins the control gate and which is in the well region or in the part of the drift space adjoining said a highly doped zone, and wherein the VLDD region doping is also present outside the drift space of the DMOS transistor on all surface portions of active regions, which are not covered by the control gate.

2. The transistor of claim 1, further comprising:

a floating highly doped pseudo-drain region, of the same conductivity type as the highly doped drain region, is disposed between the control gate and the VLDD region, the highly-doped pseudo-drain region directly adjoining the control gate and having a maximum potential that is controlled by the region of the VLDD area, which region is totally depleted at drain voltages below the gate breakdown voltage.

3. A CMOS-compatible lateral DMOS transistor, comprising:

a gate insulator having a unitary thickness under a control gate in an entire active region through which current flows;

a doped well region near a surface of the transistor, the well region determining the transistor threshold voltage, the well region being so arranged under the control gate that the well region occupies the entire area under the control gate on an active region and ends within a drift space between the control gate and a highly doped drain region, a highly doped zone of the same conductivity type as the highly doped drain region, said highly doped zone directly adjoining the control gate;

wherein at least a semiconductor region immediately beside and under the highly doped drain region has a markedly lower doping concentration in comparison with the doping concentration of the well region, wherein the drift space between the control gate and the highly doped drain region has a surface that is totally covered by a VLDD region of the same conductivity type as the drain region, wherein the VLDD region is lowly doped in comparison with the highly doped drain region, the area-related net doping concentration in the VLDD region not exceeding a value of $5 \times 10^{12}$ At/cm$^2$, such that upon application or a drain voltage which is below the breakdown voltage of the gate insulator the VLDD region is totally depleted of free charge carriers up to the semiconductor surface, at least in the part of the drift space, which adjoins the control gate and which is in the well region or in the part of the drift space adjoining said highly doped zone, and wherein the VLDD region has an area-related doping amount in the well region up to the drain edge of the control gate that is higher than outside the well region at the boundary to the highly doped drain region.

4. The transistor of claim 3, wherein an annular drift space surrounds the highly doped drain region, and an annular control gate in turn surrounds the annular drift space, wherein outside the more highly doped portion of the VLDD region, adjoining the control gate, the drift space is provided with at least one floating highly doped regions of the same conductivity type as the highly doped drain region, wherein each said at least one floating highly-doped region in is turn so connected to a metal ring arranged concentrically around the drain region that the outer edges of the metal ring or of a plurality of concentrically arranged metal rings extend approximately parallel to the equipotential lines of the drift space surface and in that case the concentric metal ring or rings are a constituent part of one or more conductor track planes of the standard conductor track system for integrated circuits.

5. The transistor of claim 4, further comprising:

a floating highly doped pseudo-drain region, of the same conductivity type as the highly doped drain region, is disposed between the control gate and the VLDD region, the highly-doped pseudo-drain region directly adjoining the control gate and having a maximum potential that is controlled by the region of the VLDD area, which region is totally depleted at drain voltages below the gate breakdown voltage.

6. A CMOS-compatible lateral DMOS transistor, comprising:

a gate insulator having a unitary thickness under a control gate in an entire active region through which current flows;

a doped well region near a surface of the transistor, the well region determining the transistor threshold voltage, the well region being so arranged under the control gate that the well region occupies the entire area under the control gate on an active region and ends within a drift space between the control gate and a highly doped drain region, a highly doped zone of the same conductivity type as the highly doped drain region, said highly doped zone directly adjoining the control gate;

wherein at least a semiconductor region immediately beside and under the highly doped drain region has a markedly lower doping concentration in comparison with the doping concentration of the well region, wherein the drift space has a surface that is totally covered by a VLDD region of the same conductivity type as the drain region, wherein the VLDD region is lowly doped in comparison with the highly doped drain region, the area-related net doping concentration in the VLDD region not exceeding a value of $5 \times 10^{12}$ At/cm$^2$, such that upon application of a drain voltage which is below the breakdown voltage or the gate insulator the VLDD region is totally depleted of free charge carriers up to the semiconductor surface, at least in the part of the drift space, which adjoins the control gate and which is in the well region or in the part of the drift space adjoining said highly doped zone, and wherein the VLDD region has an area-related doping amount in the well region up to the drain edge of the control gate and in a further zone of the drift space, which directly adjoins the highly doped drain region, that is higher than in the other region of the drift space.

7. The transistor of claim 6, wherein an annular drift space surrounds the highly doped drain region and an annular control gate in turn surrounds the annular drift space, wherein outside the more highly doped portion of the VLDD region, adjoining the control gate, the drift space is provided with at least one floating highly doped regions of the same conductivity type as the highly doped drain region, wherein each said at least one floating highly-doped region is in turn so connected to a metal ring arranged concentrically around the drain region that the outer edges of the metal ring or of a plurality of concentrically arranged metal rings extend approximately parallel to the equipotential lines of the drift space surface and in that case the concentric metal ring or rings are a constituent part of one or more conductor track planes of the standard conductor track system for integrated circuits.

8. The transistor of claim 7, further comprising:

a floating highly doped pseudo-drain region, of the same conductivity type as the highly doped drain region, is disposed between the control gate and the VLDD region, the highly-doped pseudo-drain region directly adjoining the control gate and having a maximum potential that is controlled by the region of the VLDD area, which region is totally depleted at drain voltages below the gate breakdown voltage.

* * * * *